US010672679B2

(12) United States Patent
Qu

(10) Patent No.: US 10,672,679 B2
(45) Date of Patent: Jun. 2, 2020

(54) HEAT SPREADERS FOR MULTIPLE SEMICONDUCTOR DEVICE MODULES

(71) Applicant: Micron Technology, Inc., Boise, ID (US)

(72) Inventor: Xiaopeng Qu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/118,889

(22) Filed: Aug. 31, 2018

(65) Prior Publication Data

US 2020/0075451 A1    Mar. 5, 2020

(51) Int. Cl.
*H05K 7/20* (2006.01)
*H01L 23/367* (2006.01)
*G06F 1/20* (2006.01)

(52) U.S. Cl.
CPC ............. *H01L 23/367* (2013.01); *G06F 1/20* (2013.01); *H05K 7/2039* (2013.01); *H05K 7/20172* (2013.01)

(58) Field of Classification Search
CPC .................................................. H05K 7/20509
USPC ........................ 361/695–703, 711, 715–717
See application file for complete search history.

(56) References Cited

U.S. PATENT DOCUMENTS

| 7,023,701 | B2 * | 4/2006 | Stocken | G06F 1/20 |
| | | | | 165/185 |
| 7,289,331 | B2 | 10/2007 | Foster et al. | |
| 7,593,229 | B2 * | 9/2009 | Shuy | F21K 9/00 |
| | | | | 361/705 |
| 7,969,736 | B1 * | 6/2011 | Iyengar | H01L 23/36 |
| | | | | 165/104.33 |
| 8,059,406 | B1 * | 11/2011 | Meyer, IV | F28D 15/0233 |
| | | | | 165/104.21 |
| 9,089,076 | B2 * | 7/2015 | Cox | G06F 1/20 |
| 9,754,856 | B2 | 9/2017 | Caroff et al. | |
| 2004/0218367 | A1 * | 11/2004 | Lin | H05K 1/144 |
| | | | | 361/721 |
| 2005/0201063 | A1 * | 9/2005 | Lee | H01L 23/3672 |
| | | | | 361/715 |
| 2006/0278371 | A1 * | 12/2006 | Karidis | H01L 23/427 |
| | | | | 165/104.33 |
| 2007/0070607 | A1 * | 3/2007 | Goodwin | H01L 23/367 |
| | | | | 361/719 |
| 2009/0129026 | A1 | 5/2009 | Baek et al. | |
| 2009/0219687 | A1 * | 9/2009 | Lin | H01L 23/467 |
| | | | | 361/695 |

(Continued)

*Primary Examiner* — Anthony Q Edwards
(74) *Attorney, Agent, or Firm* — Perkins Coie LLP

(57) ABSTRACT

A heat spreader for use in a memory system is provided, including a thermally conductive body having a first planar side surface and a second planar side surface opposite the first planar side surface, the first planar side surface configured to attach to a first plurality of co-planar semiconductor devices of a first memory module of the memory system, the second planar side surface configured to attach to a second plurality of co-planar semiconductor devices of a second memory module of the memory system, wherein the first planar side surface and the second planar side surface are separated by a body width w substantially equal to a distance between the first plurality of co-planar semiconductor devices and the second plurality of co-planar semiconductor devices.

20 Claims, 11 Drawing Sheets

(56) References Cited

U.S. PATENT DOCUMENTS

| | | | |
|---|---|---|---|
| 2009/0310295 A1* | 12/2009 | Chou | H01L 23/40 361/679.48 |
| 2010/0188817 A1* | 7/2010 | Chou | H01L 23/467 361/697 |
| 2012/0162919 A1* | 6/2012 | Lin | H01L 23/3675 361/704 |
| 2013/0194745 A1* | 8/2013 | Meijer | G06F 1/20 361/679.47 |
| 2013/0306292 A1* | 11/2013 | Iyengar | H01L 23/3672 165/185 |
| 2016/0351468 A1 | 12/2016 | Liang | |

\* cited by examiner

*Prior Art*

*Prior Art*

HEAT SPREADERS FOR MULTIPLE SEMICONDUCTOR DEVICE MODULES

TECHNICAL FIELD

The present disclosure generally relates to semiconductor devices, and more particularly relates to heat spreaders for multiple semiconductor device modules.

BACKGROUND

Memory packages or modules typically include multiple memory devices mounted on a substrate. Memory devices are widely used to store information related to various electronic devices such as computers, wireless communication devices, cameras, digital displays, and the like. Information is stored by programming different states of a memory cell. Various types of memory devices exist, including magnetic hard disks, random access memory (RAM), read only memory (ROM), dynamic RAM (DRAM), synchronous dynamic RAM (SDRAM), and others.

Improving memory packages, generally, may include increasing memory cell density, increasing read/write speeds or otherwise reducing operational latency, increasing reliability, increasing data retention, reducing power consumption, reducing manufacturing costs, and reducing the size or footprint of the memory devices and/or components of the memory devices, among other metrics. A challenge associated with improving memory packages is that improvements often result in increased heat generation—e.g., as a result of increasing memory device density, increasing the speed or processing ability of the memory devices, etc. Without sufficient cooling, the additional heating can cause the memory devices to reach temperatures above their maximum operating temperatures ($T_{max}$).

DETAILED DESCRIPTION

Specific details of several embodiments of memory modules having heat spreaders, and associated systems and methods, are described below with reference to the appended Figures. In several of the embodiments, a memory system can include multiple memory modules, such as dual in-line memory modules (DIMMs), each having a substrate and a plurality of memories electrically coupled to the substrate. The memories can include first and second memories on a front side and a back side of the substrate, respectively. A heat spreader can be provided to conduct thermal energy away from the memories. The heat spreader can include a thermally conductive body having a first planar side surface and a second planar side surface opposite the first planar side surface, the first planar side surface configured to attach to a first plurality of co-planar semiconductor devices of a first memory module of the memory system, the second planar side surface configured to attach to a second plurality of co-planar semiconductor devices of a second memory module of the memory system, wherein the first planar side surface and the second planar side surface are separated by a body width w substantially equal to a distance between the first plurality of co-planar semiconductor devices and the second plurality of co-planar semiconductor devices.

Figure 1:
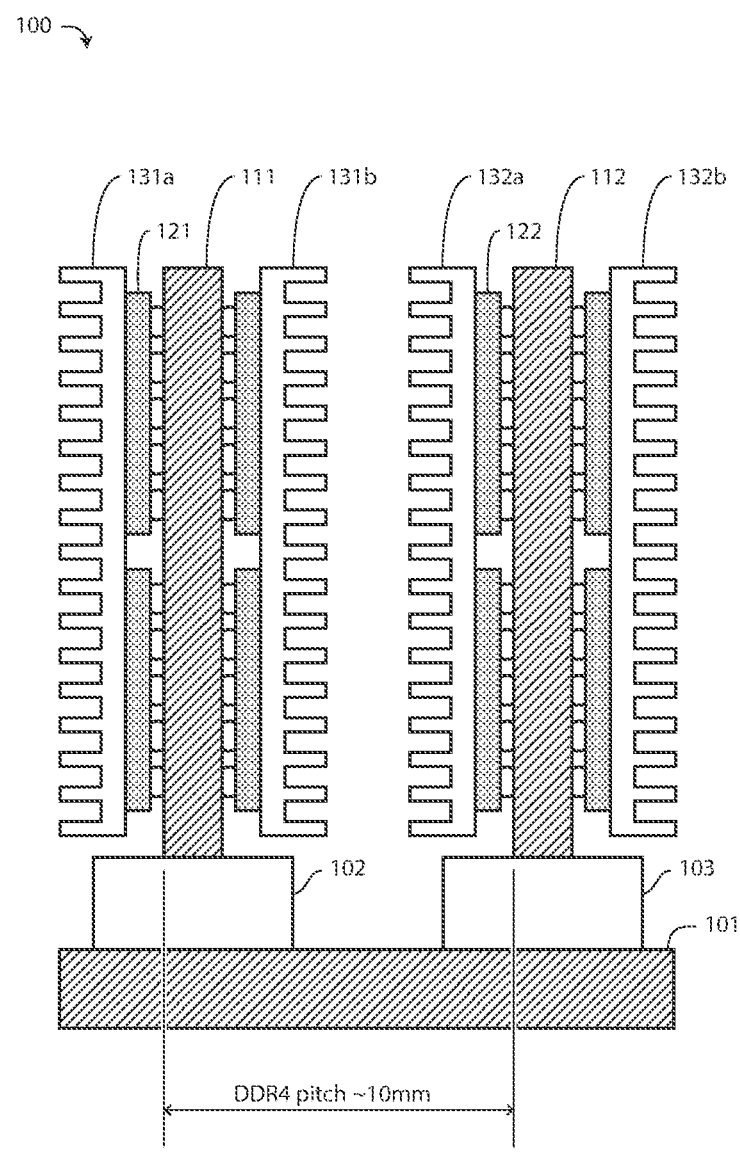
FIGS. 1 and 2 illustrates memory systems with multiple memory modules.

FIG. 1 illustrates a memory system including multiple memory modules. Memory system 100 may include a computing device 101 (e.g., a motherboard) to which memory modules 111 and 112 are connected (e.g., by memory connectors 102 and 103). Memory modules 111 and 112 can each include multiple semiconductor memory devices on either side thereof (e.g., memory dies), such as memory devices 121 and 122. In operation, memory devices 121 and 122 can generate waste heat, which can negatively impact the operation of memory system 100 if left unaddressed. Accordingly, memory system 100 can include heat spreaders, such as heat spreaders 131a and 131b attached to opposing sides of memory module 111, and heat spreaders 132a and 132b attached to opposing sides of memory module 112.

In a DDR4 memory system, memory modules 111 and 112 may be spaced apart by a predetermined pitch (e.g., of about 10 mm). Accordingly, the space available between adjacent memory modules 111 and 112 for the heat spreaders 131b and 132a is about equal to this pitch minus the thickness of one of the memory modules (e.g., with a distance between outer surfaces of opposing memory devices of a memory module being about 2.8 mm, space available for the two heat spreaders 131b and 132a to occupy is about 7.2 mm). Accordingly, if each of the heat spreaders 132a and 132b is about 2 mm thick, there remains an air gap of about 3.2 mm between the adjacent heat spreaders 132a and 132b, which is generally sufficient for airflow to help dissipate the heat conducted away from the memory devices 121 and 122.

Figure 2:
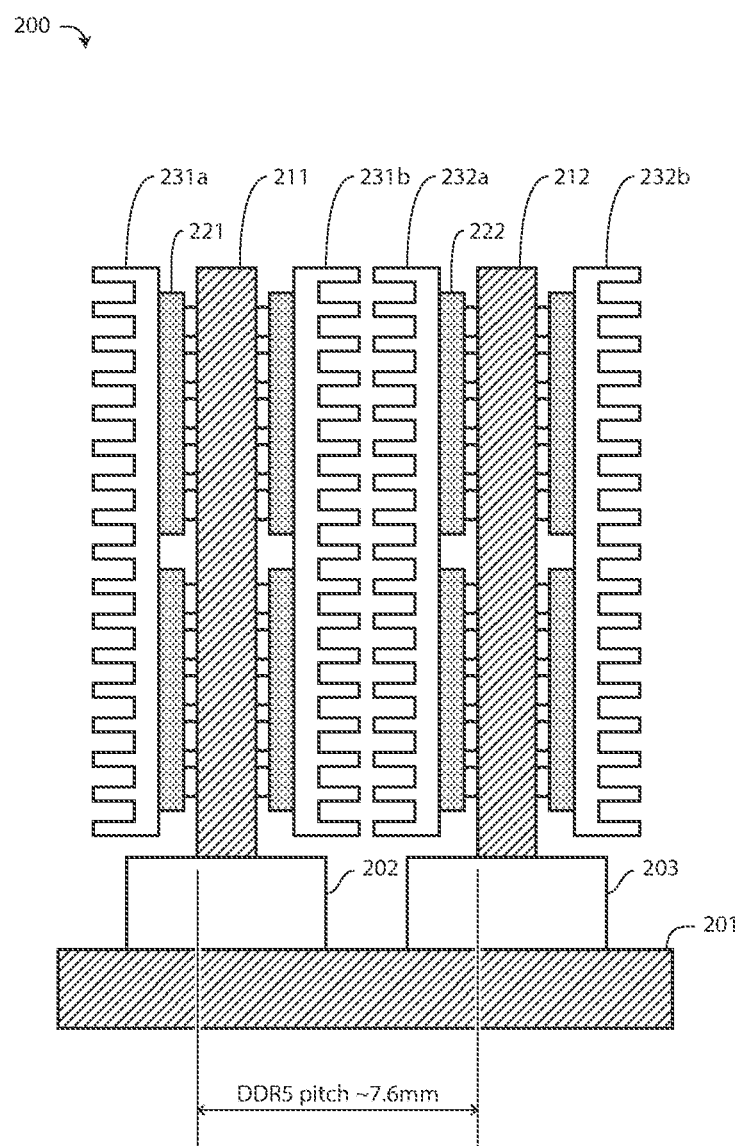

Turning to FIG. 2, a similar memory system 200 is illustrated, in which the pitch between adjacent memory modules is reduced. Memory system 200 may be a DDR5 memory system, in which the pitch between adjacent memory modules is about 7.62 mm. As can be seen with reference to FIG. 2, memory system 200 includes a computing device 201 (e.g., a motherboard) to which memory modules 211 and 212 are connected (e.g., by memory connectors 202 and 203). Memory modules 211 and 212 can each include multiple semiconductor memory devices on either side thereof (e.g., memory dies), such as memory devices 221 and 222. Memory system 200 can further include heat spreaders, such as heat spreaders 231a and 231b attached to opposing sides of memory module 211, and heat spreaders 232a and 232b attached to opposing sides of memory module 212.

Because of the reduction of pitch in a DDR5 system when compared to a DDR4 system, the space available between adjacent memory modules 211 and 212 for the heat spreaders 231b and 232a is about equal to the reduced pitch of 7.62 mm minus the thickness of one of the memory modules (e.g., with a distance between outer surfaces of opposing memory devices of a memory module being about 2.8 mm, space available for the two heat spreaders 231b and 232a to occupy is about 4.82 mm). Accordingly, if each of the heat spreaders 232a and 232b is about 2 mm thick, there remains an air gap of about 0.82 mm between the adjacent heat spreaders 232a and 232b, which is generally insufficient for airflow to help dissipate the heat conducted away from the memory devices 221 and 222.

Figure 3:
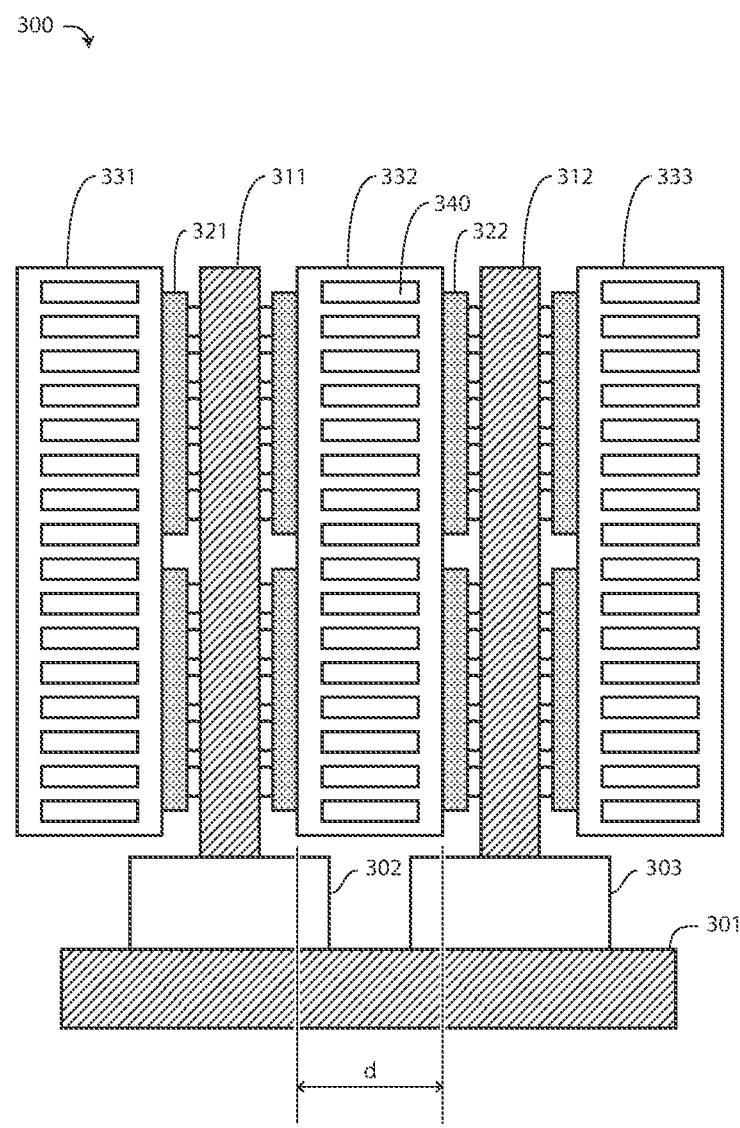
FIGS. 3-7 illustrate memory systems including heat spreaders in accordance with various embodiments of the present disclosure.

To address the foregoing problems, embodiments of the present disclosure can provide heat spreaders for multiple semiconductor device modules, to provided improved performance in memory systems with reduced spacing between adjacent memory modules. For example, FIG. 3 illustrates a memory system 300 including heat spreaders for multiple semiconductor device modules in accordance with an embodiment of the present disclosure. Memory system 300 includes a computing device 301 (e.g., a motherboard) to which memory modules 311 and 312 are connected (e.g., by memory connectors 302 and 303). Memory modules 311 and 312 can each include multiple semiconductor memory devices on either side thereof (e.g., memory dies), such as memory devices 321 and 322. Memory system 300 can further include heat spreaders, such as heat spreaders 331 and 332 attached to opposing sides of memory module 311, and heat spreaders 332 and 333 attached to opposing sides of memory module 312.

As can be seen with reference to FIG. 3, heat spreader 332 is attached to both memory module 311 and memory module 312. In this regard, memory module 332 has a thermally conductive body having a first planar side surface configured to attach to the plurality of co-planar semiconductor devices on one side of memory module 311, and a second planar side surface opposite the first planar side surface configured to attach to the plurality of co-planar semiconductor devices on a facing side of the second memory module 312. The first planar side surface and the second planar side surface are separated by a body width substantially equal to a distance d between the first plurality of co-planar semiconductor devices and the second plurality of co-planar semiconductor devices. thermally conductive body of the heat spreader 332 can be formed from a metal or another thermally conductive material (e.g., copper, aluminum, alloys thereof, graphite, thermally-conductive polymers, etc.).

In accordance with one aspect of the subject disclosure, the heat spreaders of memory system 300, such as heat spreader 332, can further include a plurality of air channels 340 configured to permit airflow from one end of the heat spreader 332 to an opposing end thereof, to facilitate the dissipation of heat from the memory devices attached thereto. The plurality of air channels 340 can be configured to receive a forced air flow from a fan disposed at one of the end surfaces of the heat spreader 332, as is described in greater detail below.

In accordance with one experimental model of a memory system with heat spreaders configured similarly to those of FIG. 3 (e.g., in which opposing sides of a heat spreader are attached to facing semiconductor devices on adjacent memory modules on opposing sides of the heat spreader), the thermal performance of the improved heat spreaders was able to dramatically reduce the operating temperature of the semiconductor devices of the memory system when compared to heat spreaders similar to those illustrated in FIG. 2. In this regard, in an ambient temperature of 0° C., and with a forced air flow having a speed of 2 m/s, the reductions in operating temperatures of the various semiconductor devices of the attached modules set forth in Table 1, below, were observed.

TABLE 1

|   | Conventional Heat Spreaders | Improved Heat Spreaders | Temperature Delta |
|---|---|---|---|
| $T_{DRAM}$ | 50.2° C. | 46.4° C. | −3.8° C. |
| $T_{RCD}$ | 52.4° C. | 48.4° C. | −4.0° C. |
| $T_{PMIC}$ | 62.5° C. | 57.7° C. | −4.8° C. |

Figure 4:
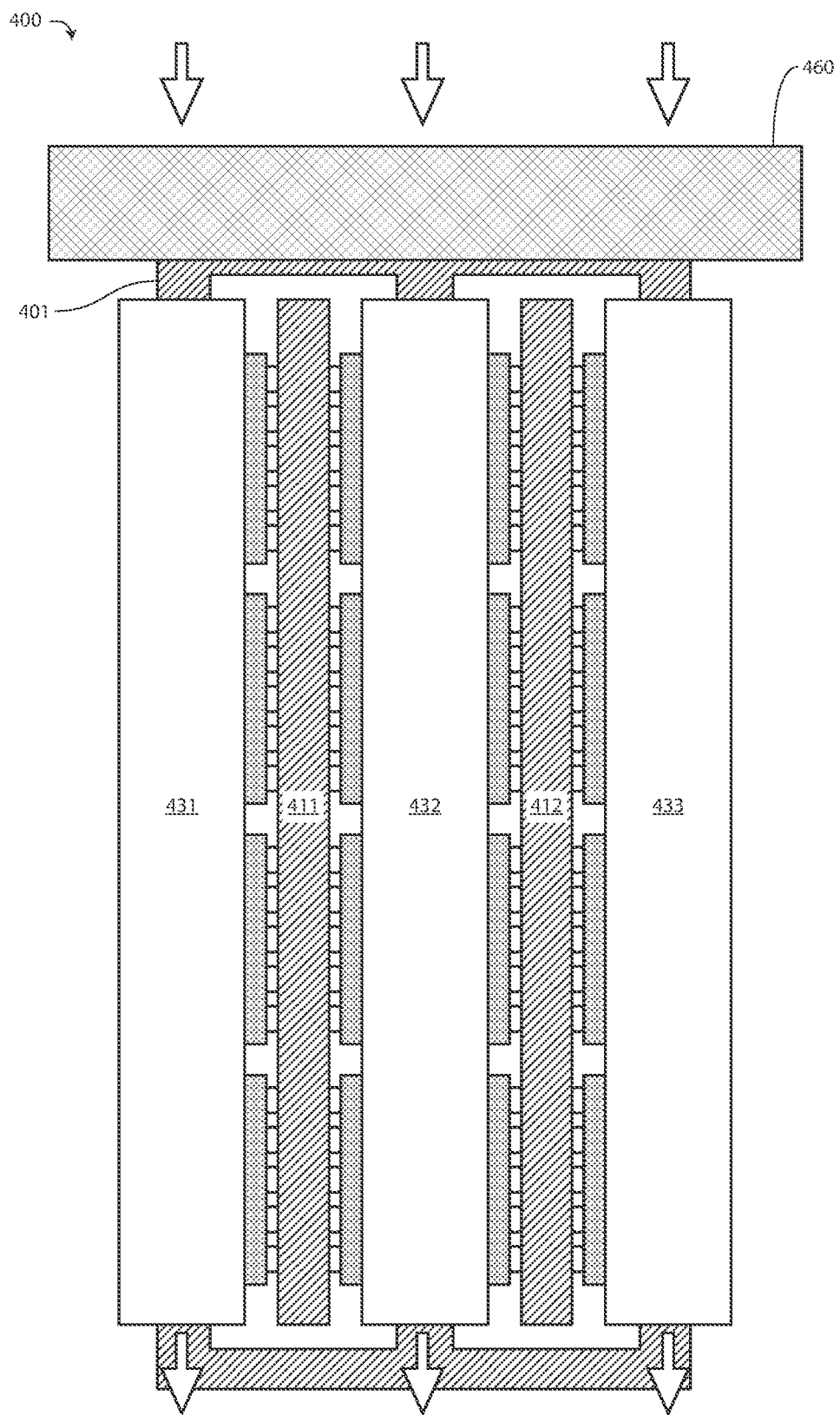

Turning to FIG. 4, a top view of a memory system 400 including heat spreaders for multiple semiconductor device modules is illustrated in accordance with an embodiment of the present disclosure. Memory system 400 includes a computing device 401 (e.g., a motherboard) to which memory modules 411 and 412 are connected. Memory modules 411 and 412 can each include multiple semiconductor memory devices on either side thereof (e.g., memory dies). Memory system 400 can further include heat spreaders, such as heat spreaders 431 and 432 attached to opposing sides of memory module 411, and heat spreaders 432 and 433 attached to opposing sides of memory module 412. The heat spreaders 431-433 can further include a plurality of air channels (not visible in the top view illustrated in FIG. 4) configured to permit airflow from one end thereof to an opposing end thereof. In this regard, the plurality of air channels can be configured to receive a forced air flow from a fan 460 disposed at one of the end surfaces of the heat spreaders. By passing the forced air flow through the plurality of air channels of the heat spreaders, heat from the memory devices of the memory system 400 can be dissipated.

Figure 5:
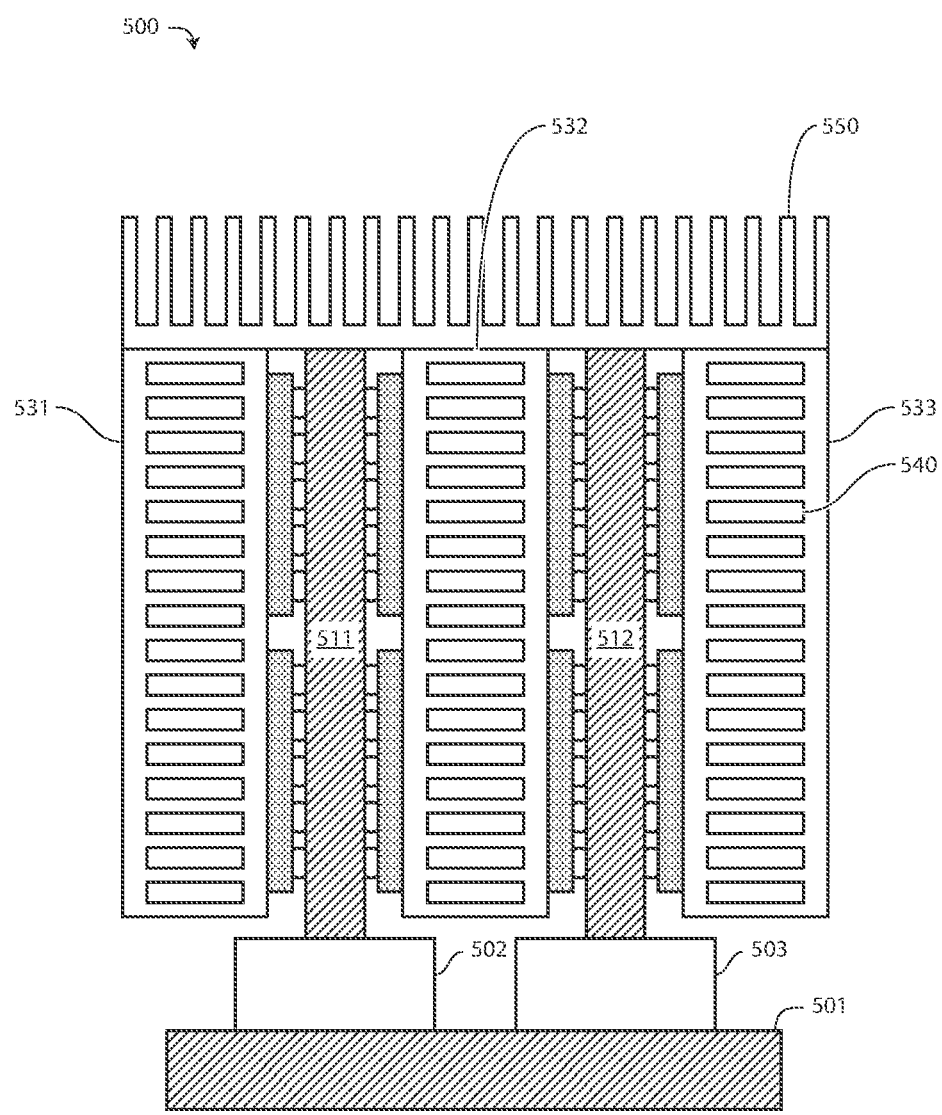

In accordance with another embodiment of the present disclosure, providing a memory system with multiple heat spreaders that have co-planar top surfaces either at or above a top surface of the memory modules to which they are attached can permit the attachment of an upper heat spreader to further increase the surface area used for heat exchange between the memory system and the surrounding atmosphere. For example, FIG. 5 illustrates a memory system including heat spreaders for multiple semiconductor device modules in accordance with one such embodiment. Memory system 500 includes a computing device 501 (e.g., a motherboard) to which memory modules 511 and 512 are connected (e.g., by memory connectors 502 and 503). Memory modules 511 and 512 can each include multiple semiconductor memory devices on either side thereof (e.g., memory dies). Memory system 500 can further include heat spreaders, such as heat spreaders 531 and 532 attached to opposing sides of memory module 511, and heat spreaders 532 and 533 attached to opposing sides of memory module 512. The heat spreaders 531-533 can further include a plurality of air channels 540 configured to permit airflow from one end thereof to an opposing end thereof. In this regard, the plurality of air channels can be configured to receive a forced air flow from a fan disposed at one of the end surfaces of the heat spreaders. Memory system 500 can further include an upper heat spreader 550 that includes a thermally conductive body and can further optionally include a plurality of channels, pins, projections, or other structures configured to increase a surface area thereof. By passing the forced air flow through the plurality of air channels and/or other surface-area increasing structures of the heat spreaders 531-533 and 550, heat from the memory devices of the memory system 500 can be dissipated.

In accordance with one experimental model of a memory system with heat spreaders configured similarly to those of FIG. 5 (e.g., in which opposing sides of a heat spreader are attached to facing semiconductor devices on adjacent memory modules on opposing sides of the heat spreader, and to an upper heat spreader with surface-area increasing structures), the thermal performance of the improved heat spreaders was able to dramatically reduce the operating temperature of the semiconductor devices of the memory system when compared to heat spreaders similar to those illustrated in FIG. 2 (albeit with an upper heat spreader not illustrated in FIG. 2). In this regard, in an ambient temperature of 0° C., and with a forced air flow having a speed of 2 m/s, the reductions in operating temperatures of the various semiconductor devices of the attached modules set forth in Table 2, below, were observed.

TABLE 2

|  | Conventional Heat Spreaders | Improved Heat Spreaders | Temperature Delta |
| --- | --- | --- | --- |
| $T_{DRAM}$ | 26.9° C. | 22.0° C. | −4.9° C. |
| $T_{RCD}$ | 30.0° C. | 25.3° C. | −4.7° C. |
| $T_{PMIC}$ | 38.0° C. | 33.2° C. | −4.8° C. |

Figure 6:
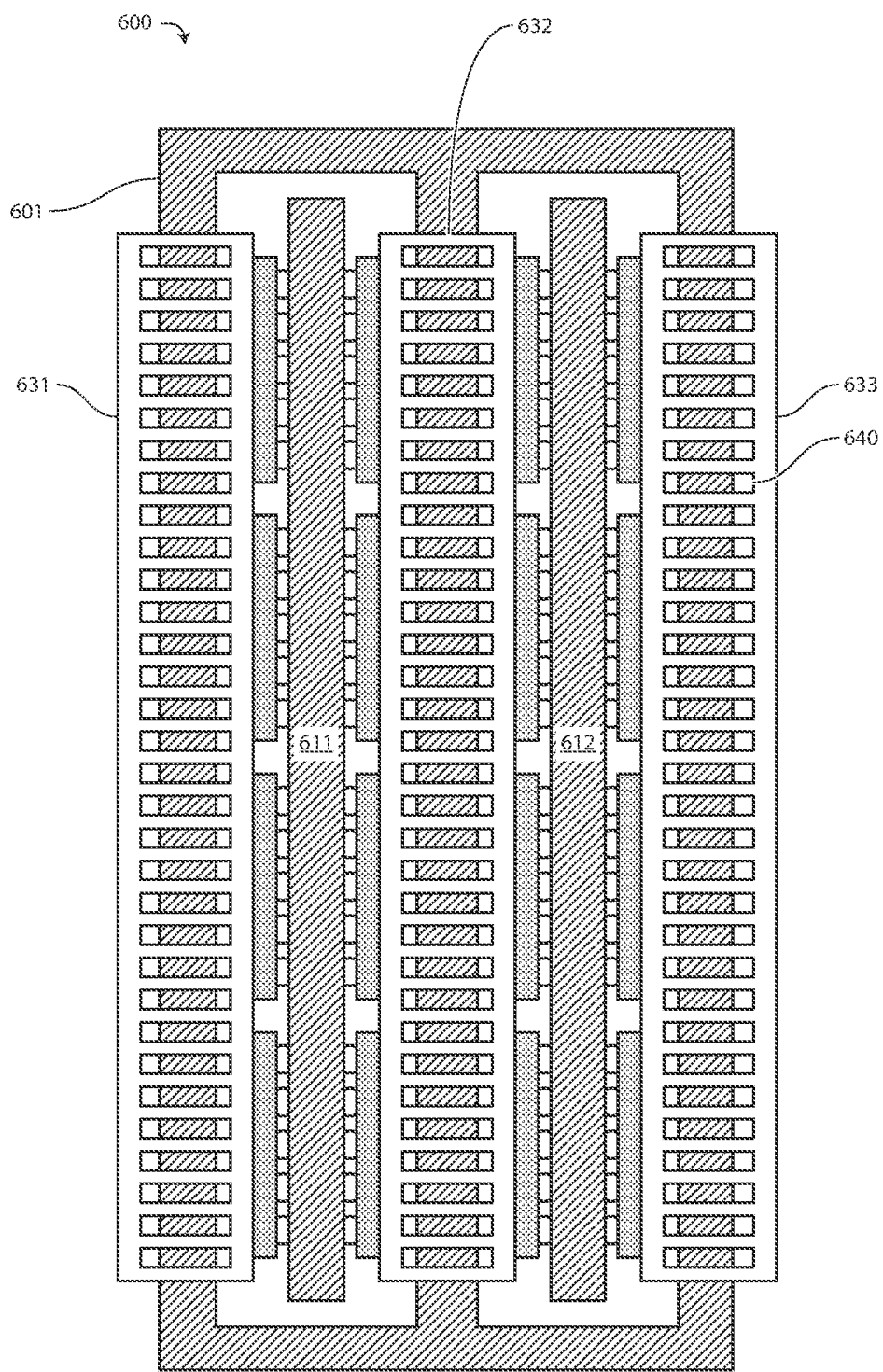

Although in the foregoing example embodiments heat spreaders including a plurality of horizontal air channels have been illustrated, in other embodiments of the present disclosure air channels having other configurations can be provided. For example, FIG. 6 illustrates a memory system including heat spreaders for multiple semiconductor device modules that have vertical air channels, in accordance with another embodiment of the present disclosure. Memory system 600 includes a computing device 601 (e.g., a motherboard) to which memory modules 611 and 612 are connected. Memory modules 611 and 612 can each include multiple semiconductor memory devices on either side thereof (e.g., memory dies). Memory system 600 can further include heat spreaders, such as heat spreaders 631 and 632 attached to opposing sides of memory module 611, and heat spreaders 632 and 633 attached to opposing sides of memory module 612. The heat spreaders 631-633 can further include a plurality of air channels 640 configured to permit airflow from one end thereof to an opposing end thereof. In this regard, the plurality of air channels can be configured to receive a forced air flow from a fan disposed at a top surface of the heat spreaders, as is described in greater detail below.

Figure 7:
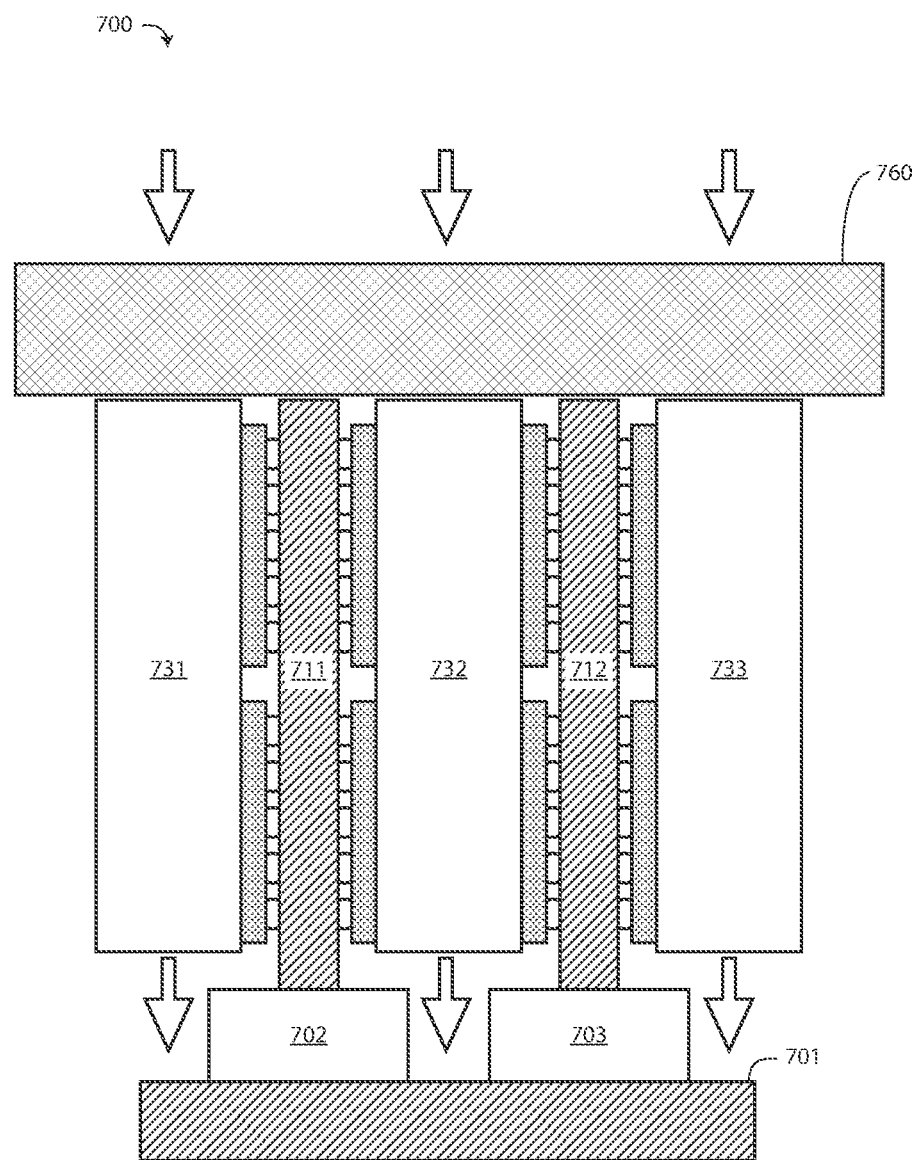

Turning to FIG. 7, an end view of a memory system 700 including heat spreaders for multiple semiconductor device modules is illustrated in accordance with an embodiment of the present disclosure. Memory system 700 includes a computing device 701 (e.g., a motherboard) to which memory modules 711 and 712 are connected (e.g., by memory connectors 702 and 703). Memory modules 711 and 712 can each include multiple semiconductor memory devices on either side thereof (e.g., memory dies). Memory system 700 can further include heat spreaders, such as heat spreaders 731 and 732 attached to opposing sides of memory module 711, and heat spreaders 732 and 733 attached to opposing sides of memory module 712. The heat spreaders 731-733 can further include a plurality of vertical air channels (not visible in the end view illustrated in FIG. 7) configured to permit airflow from a top surface thereof to a bottom surface thereof. In this regard, the plurality of air channels can be configured to receive a forced air flow from a fan 760 disposed over the top surface of the heat spreaders. By passing the forced air flow through the plurality of air channels of the heat spreaders, heat from the memory devices of the memory system 700 can be dissipated.

Figure 8A:
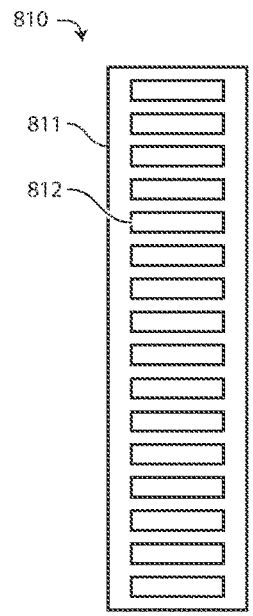
FIGS. 8A-8D illustrate heat spreaders in accordance with various embodiments of the present disclosure.
Figure 8B:
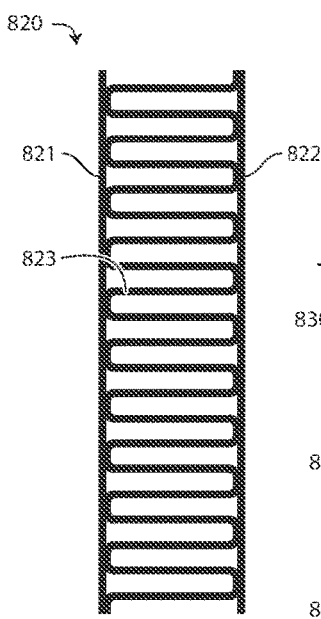

Although in the foregoing example embodiments heat spreaders have been illustrated as solid thermally conductive bodies with rectilinear air channels passing therethrough, in other embodiments of the present disclosure, heat spreaders with other configurations of air channels can be provided. For example, FIGS. 8A-8D illustrate various configurations of heat spreaders having thermally conductive bodies and a plurality of air channels therethrough. In this regard, FIG. 8A illustrates an embodiment in which a heat spreader 810 includes a thermally conductive body 811 through which a plurality of air channels 812 have been provided (e.g., by extrusion, machining, or the like). The thermally conductive body 811 can be formed from a metal or another thermally conductive material (e.g., copper, aluminum, alloys thereof, graphite, thermally-conductive polymers, etc.). FIG. 8B illustrates another embodiment in which a heat spreader 820 has a thermally conductive body formed from two side walls 821 and 822, as well as a rectilinear pleated/corrugated inner member 823 attached thereto (e.g., by adhesive, soldering, welding or the like). The side walls 821 and 822 and inner member 823 can be formed from a metal or another thermally conductive material (e.g., copper, aluminum, alloys thereof, graphite, thermally-conductive polymers, etc.). The side walls 821 and 822 and inner member 823 can be formed from the same materials, or from different materials.

Figure 8C:
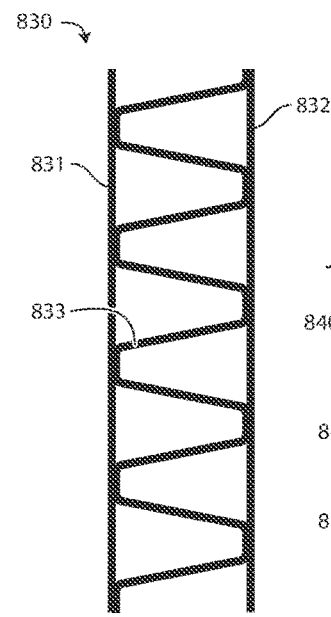

FIG. 8C illustrates another embodiment in which a heat spreader 830 has a thermally conductive body formed from two side walls 831 and 832, as well as a pleated/corrugated inner member 833 attached thereto (e.g., by adhesive, soldering, welding or the like). Unlike the inner member 823 of FIG. 8B, the inner member 833 of heat spreader 830 includes portions that slope between the side walls 831 and 832 at non-right angles, thereby increasing the relative size of the air channels and decreasing the amount of material (and therefore also the thermal mass) of the heat spreader 830. The side walls 831 and 832 and inner member 833 can be formed from a metal or another thermally conductive material (e.g., copper, aluminum, alloys thereof, graphite, thermally-conductive polymers, etc.). The side walls 831 and 832 and inner member 833 can be formed from the same materials, or from different materials.

Figure 8D:
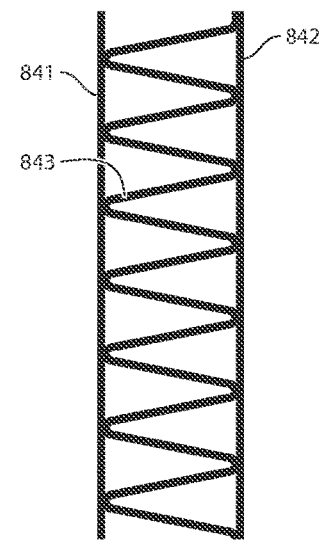

FIG. 8D illustrates another embodiment in which a heat spreader 840 has a thermally conductive body formed from two side walls 841 and 842, as well as a pleated/corrugated inner member 843 attached thereto (e.g., by adhesive, soldering, welding or the like). Like the inner member 833 of FIG. 8C, the inner member 843 of heat spreader 840 includes portions that slope between the side walls 841 and 842 at non-right angles, but more closely-spaced, thereby somewhat increasing the amount of material (and therefore also the thermal mass) of the heat spreader 840. The side walls 841 and 842 and inner member 843 can be formed from a metal or another thermally conductive material (e.g., copper, aluminum, alloys thereof, graphite, thermally-conductive polymers, etc.). The side walls 841 and 842 and inner member 843 can be formed from the same materials, or from different materials.

Figure 9:
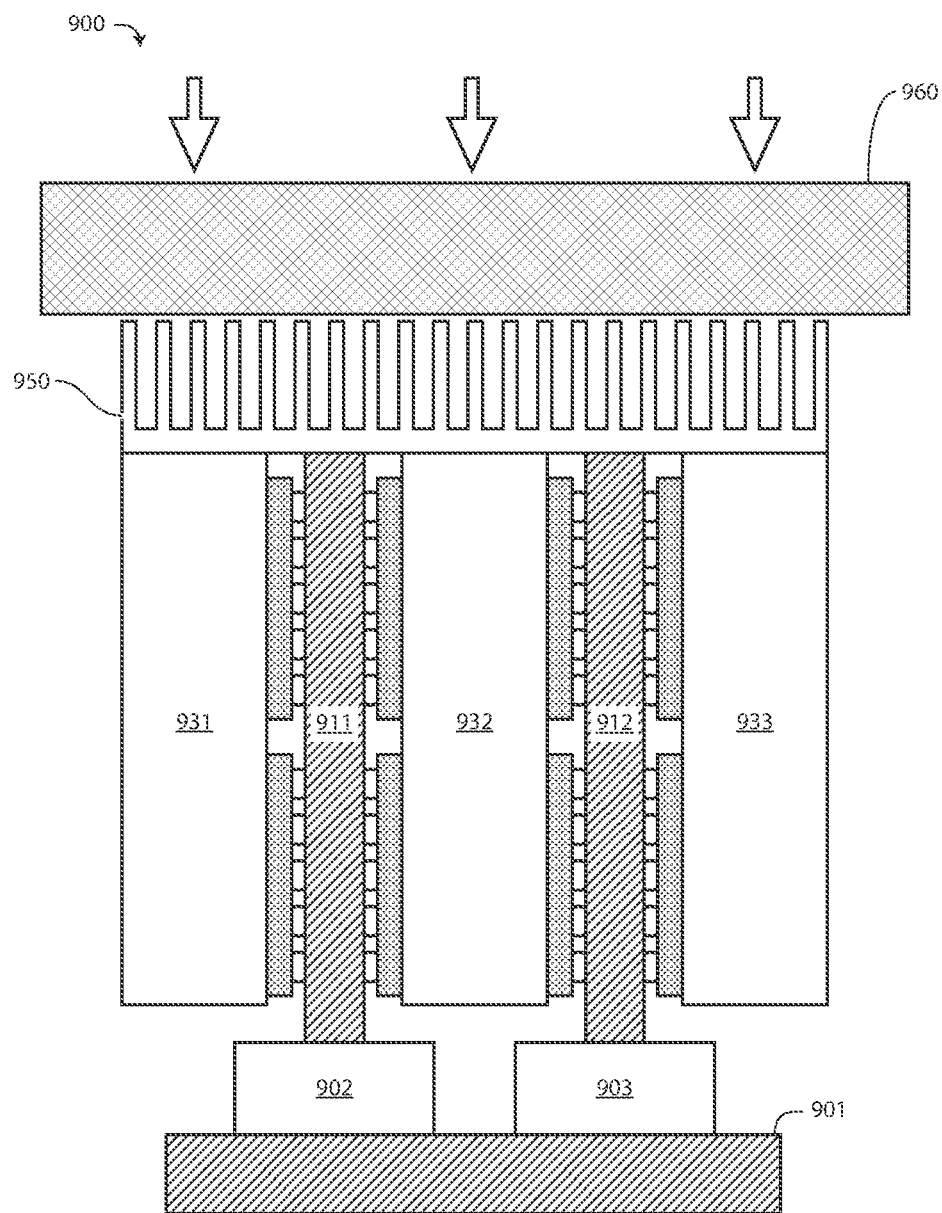
FIGS. 9-10 illustrate memory systems including heat spreaders in accordance with various embodiments of the present disclosure.

Although in the foregoing example embodiments illustrated and set forth above, heat spreaders including air channels have been described, in other embodiments of the present disclosure heat spreaders can be monolithic structures without air channels, relying instead on the conduction of heat to another location from which heat can be dissipated. For example, FIG. 9 illustrates a memory system 900 including heat spreaders for multiple semiconductor device modules in accordance with an embodiment of the present disclosure. Memory system 900 includes a computing device 901 (e.g., a motherboard) to which memory modules 911 and 912 are connected (e.g., by memory connectors 902 and 903). Memory modules 911 and 912 can each include multiple semiconductor memory devices on either side thereof (e.g., memory dies). Memory system 900 can further include heat spreaders, such as heat spreaders 931 and 932 attached to opposing sides of memory module 911, and heat spreaders 932 and 933 attached to opposing sides of memory module 912. The heat spreaders 931-933 can each be a monolithic structure (e.g., a thermally-conductive solid body) configured to conduct thermal energy to another location for dissipation. In this regard, memory system 900 can further include an upper heat spreader 950 that includes a thermally conductive body and can further optionally include a plurality of channels, pins, projections, or other structures configured to increase a surface area thereof. By passing a forced air flow (e.g., from a fan 960) through the surface-area increasing structures of the upper heat spreaders 950, heat from the memory devices of the memory system 900 can be dissipated. In another embodiment, the fan 960 can be omitted, if the amount of heat to be dissipated from the memory system does not exceed the passive heat dissipation capability of the upper heat spreader 950.

Figure 10:
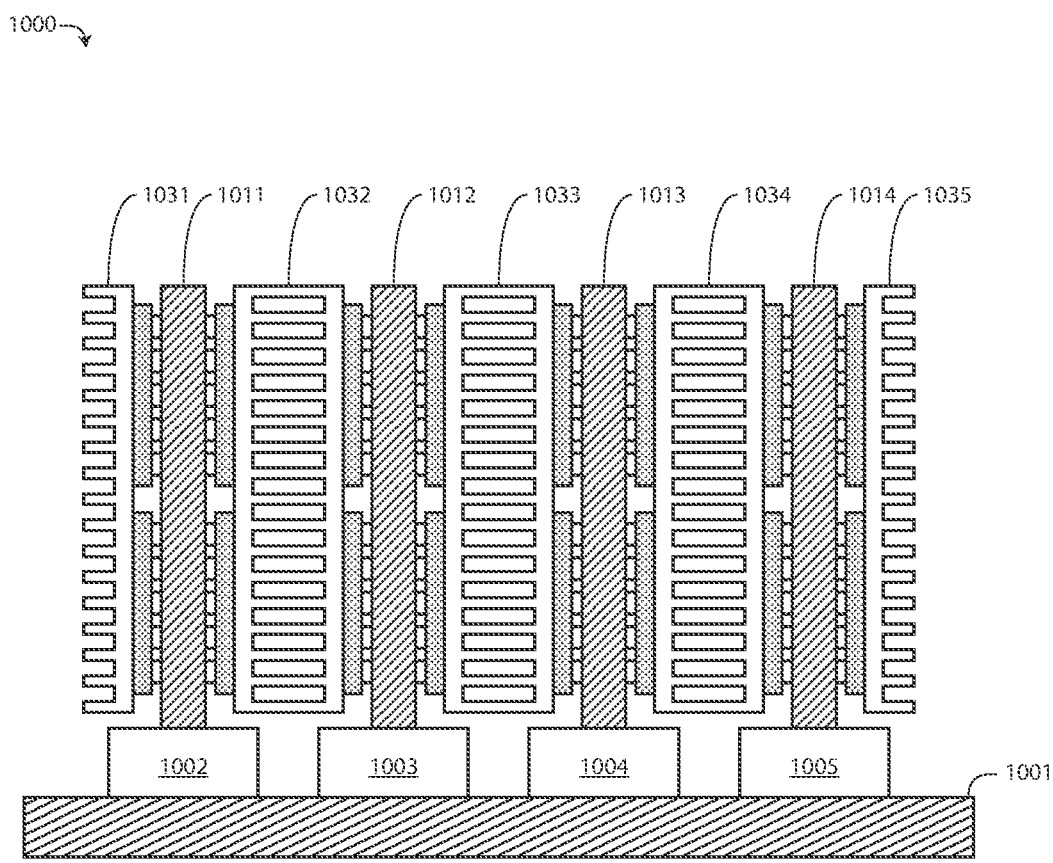

Although in the foregoing example embodiments memory systems with two memory modules have been illustrated and described, in other embodiments of the present disclosure a memory system can include more than two memory modules. For example, FIG. 10 illustrates a memory system 1000 including heat spreaders for multiple semiconductor device modules in accordance with an embodiment of the present disclosure. Memory system 1000 includes a computing device 1001 (e.g., a motherboard) to which memory modules 1011-1014 are connected (e.g., by memory connectors 1002-1005). Memory modules 1011-1014 can each include multiple semiconductor memory devices on either side thereof (e.g., memory dies). Memory system 1000 can further include heat spreaders, such as heat spreaders 1031 and 1032 attached to opposing sides of memory module 1011, heat spreaders 1032 and 1033 attached to opposing sides of memory module 1012, heat spreaders 1033 and 1034 attached to opposing sides of memory module 1013, and heat spreaders 1034 and 1035 attached to opposing sides of memory module 1014.

The heat spreaders 1032-1034 that are disposed between adjacent memory modules can each have a thermally conductive body having a first planar side surface configured to attach to the plurality of co-planar semiconductor devices on one side of a first memory module adjacent thereto, and a second planar side surface opposite the first planar side surface configured to attach to the plurality of co-planar semiconductor devices on a facing side of a second memory module adjacent thereto opposite the first memory module. The first planar side surface and the second planar side surface are separated by a body width substantially equal to a distance d between the first plurality of co-planar semiconductor devices and the second plurality of co-planar semiconductor devices to which the heat spreader is attached.

The heat spreaders 1031 and 1035 on outermost memory modules 1011 and 1014, respectively, can be the same as the heat spreaders 1032-1034 between adjacent memory modules, or can be different (e.g., similar to the heat spreaders 131a and 132b of FIG. 1). Depending upon the configuration of the memory system 1000, there may or may not be sufficient room on an outer surface of a memory module for a heat spreader with an increased body width, such as heat spreaders 1032-1034.

Figure 11:
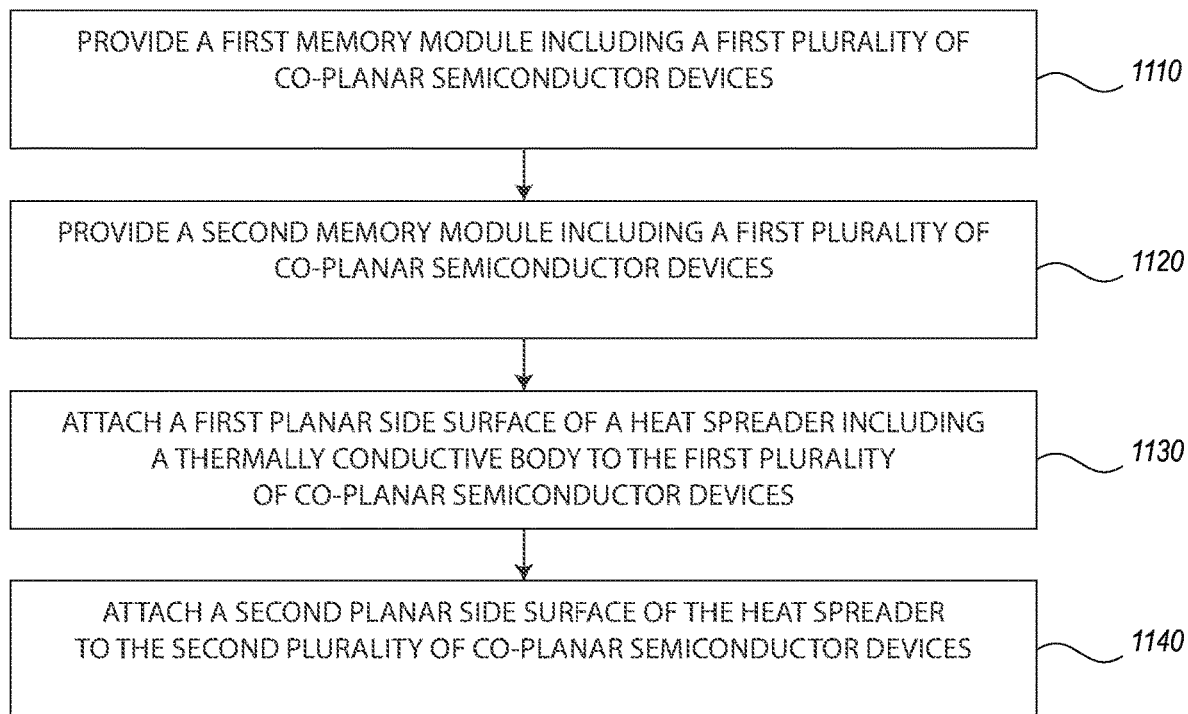
FIG. 11 is a flow chart illustrating a method of configuring a memory system in accordance with an embodiment of the present disclosure.

FIG. 11 is a flow chart illustrating a method of configuring a memory system in accordance with an embodiment of the present disclosure. The method includes providing a first memory module including a first plurality of co-planar semiconductor devices (box 1110) and providing a second memory module including a second plurality of co-planar semiconductor devices (box 1120). The method further includes attaching a first planar side surface of a heat spreader including a thermally conductive body to the first plurality of co-planar semiconductor devices (box 1130) and attaching a second planar side surface of the heat spreader to the second plurality of co-planar semiconductor devices (box 1140).

Numerous specific details are discussed to provide a thorough and enabling description of embodiments of the present technology. A person skilled in the art, however, will understand that the technology may have additional embodiments and that the technology may be practiced without several of the details of the embodiments described below with reference to the appended Figures. In other instances, well-known structures or operations often associated with memory devices are not shown, or are not described in detail, to avoid obscuring other aspects of the technology. In general, it should be understood that various other devices and systems in addition to those specific embodiments disclosed herein may be within the scope of the present technology. For example, in the illustrated embodiments, the memory devices and systems are primarily described in the context of DIMMs compatible with DRAM and flash (e.g., NAND and/or NOR) storage media. Memory devices and systems configured in accordance with other embodiments of the present technology, however, can include memory modules compatible with other types of storage media, including PCM, RRAM, MRAM, read only memory (ROM), erasable programmable ROM (EPROM), electrically erasable programmable ROM (EEROM), ferroelectric, magnetoresistive, and other storage media, including static random-access memory (SRAM). Additionally, at least some of the heat spreaders described herein may be useful in semiconductor packages other than memory packages.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:

1. A heat spreader configured for use in a memory system, comprising:
   a monolithic thermally conductive body having a first planar side surface and a second planar side surface opposite the first planar side surface, the first planar side surface configured to attach to a first plurality of co-planar semiconductor devices of a first memory module of the memory system, the second planar side surface configured to attach to a second plurality of co-planar semiconductor devices of a second memory module of the memory system,
   wherein the first planar side surface and the second planar side surface are separated by a body width w substantially equal to a distance between the first plurality of co-planar semiconductor devices and the second plurality of co-planar semiconductor devices.

2. The heat spreader of claim 1, wherein the thermally conductive body includes a plurality of air channels extending between the first and second planar side surfaces.

3. The heat spreader of claim 2, wherein the plurality of air channels is configured to receive a forced air flow from a fan disposed at an end surface of the thermally conductive body.

4. The heat spreader of claim 2, wherein the plurality of air channels is defined by an internal corrugation of the thermally conductive body.

5. The heat spreader of claim 1, further comprising:
   a first layer of thermally conductive adhesive disposed on the first planar side surface and configured to attach the first planar side surface to the first plurality of co-planar semiconductor devices; and
   a second layer of thermally conductive adhesive disposed on the second planar side surface and configured to attach the second planar side surface to the second plurality of co-planar semiconductor devices.

6. The heat spreader of claim 1, wherein the thermally conductive body is a first thermally conductive body further including a top surface configured to be attached to a second thermally conductive body.

7. The heat spreader of claim 1, wherein the first and second memory modules are DDR5 DRAM memory modules.

8. The heat spreader of claim 1, wherein the body width w is between 2 and 6 mm.

9. The heat spreader of claim 1, wherein the thermally conductive body comprises copper, aluminum, a combination thereof, or an alloy thereof.

10. A memory system comprising:
    a first memory module including a first plurality of co-planar semiconductor devices;
    a second memory module including a second plurality of co-planar semiconductor devices; and
    a heat spreader including a monolithic thermally conductive body having a first planar side surface attached to the first plurality of co-planar semiconductor devices and a second planar side surface attached to the second plurality of co-planar semiconductor devices,
    wherein the first planar side surface and the second planar side surface are separated by a body width w substantially equal to a distance between the first plurality of co-planar semiconductor devices and the second plurality of co-planar semiconductor devices.

11. The memory system of claim 10, wherein the thermally conductive body includes a plurality of air channels extending between the first and second planar side surfaces.

12. The memory system of claim 11, wherein the plurality of air channels is configured to receive a forced air flow from a fan disposed at an end surface of the thermally conductive body.

13. The memory system of claim 11, wherein the plurality of air channels is defined by an internal corrugation of the thermally conductive body.

14. The memory system of claim 10, further comprising:
    a first layer of thermally conductive adhesive attaching the first planar side surface to the first plurality of co-planar semiconductor devices; and
    a second layer of thermally conductive adhesive attaching the second planar side surface to the second plurality of co-planar semiconductor devices.

15. The memory system of claim 10, wherein the heat spreader is a first heat spreader and the thermally conductive body is a first thermally conductive body, and further including a second heat spreader having a second thermally conductive body attached to a top surface of the first thermally conductive body.

16. The memory system of claim 15, wherein the second thermally conductive body includes a plurality of radiating structures configured to exchange heat.

17. The memory system of claim 15, further comprising a fan configured to direct a forced air flow over the second thermally conductive body.

18. The memory system of claim 10, wherein the first and second memory modules are DDR5 DRAM memory modules.

19. The memory system of claim 10, wherein the body width w is between 2 and 6 mm.

20. The memory system of claim 10, wherein the thermally conductive body comprises copper, aluminum, a combination thereof, or an alloy thereof.

* * * * *